(12) United States Patent
Maeda et al.

(10) Patent No.: US 12,131,971 B2
(45) Date of Patent: Oct. 29, 2024

(54) SEMICONDUCTOR MODULE

(71) Applicant: Sansha Electric Manufacturing Co., Ltd., Osaka (JP)

(72) Inventors: Shohei Maeda, Osaka (JP); Yoichi Makimoto, Osaka (JP)

(73) Assignee: SANSHA ELECTRIC MANUFACTURING CO., LTD., Osaka (JP)

( * ) Notice: Subject to any disclaimer, the term of this patent is extended or adjusted under 35 U.S.C. 154(b) by 472 days.

(21) Appl. No.: 17/629,054

(22) PCT Filed: Dec. 24, 2019

(86) PCT No.: PCT/JP2019/050626
§ 371 (c)(1),
(2) Date: Jan. 21, 2022

(87) PCT Pub. No.: WO2021/019802
PCT Pub. Date: Feb. 4, 2021

(65) Prior Publication Data
US 2022/0278008 A1  Sep. 1, 2022

(30) Foreign Application Priority Data

Jul. 30, 2019  (JP) .................................. 2019-139877
Aug. 8, 2019  (JP) .................................. 2019-145935

(51) Int. Cl.
*H01L 23/31*  (2006.01)
*H01L 23/13*  (2006.01)
(Continued)

(52) U.S. Cl.
CPC ......... *H01L 23/3107* (2013.01); *H01L 23/13* (2013.01); *H01L 23/49838* (2013.01); *H02M 7/003* (2013.01)

(58) Field of Classification Search
CPC ................. H01L 23/3107; H01L 23/13; H01L 23/49839; H01L 25/04; H01L 25/07;
(Continued)

(56) References Cited

U.S. PATENT DOCUMENTS 6,290,552 B1  9/2001  Saito
9,147,666 B2 *  9/2015  Yoshihara ............. H01L 25/072
(Continued)

FOREIGN PATENT DOCUMENTS

JP  H06-021603 A  1/1994
JP  H10-84078 A  3/1998
(Continued)

OTHER PUBLICATIONS

International Search Report for corresponding Application No. PCT/JP2019/050626, mailed on Mar. 24, 2020.

*Primary Examiner* — Galina G Yushina
(74) *Attorney, Agent, or Firm* — Renner, Otto, Boisselle & Sklar, LLP

(57) ABSTRACT

A semiconductor module includes a case accommodating a semiconductor element inside and being entirely molded by a resin, a first terminal placed on a top portion of the case and being a terminal to which a bus bar being a flat and elongated metal conductor is to be attached, a second terminal provided on the top portion of the case and being adjacent to the first terminal, and a rib provided between the first terminal and the second terminal. The rib includes a protrusion protruding toward the bus bar.

8 Claims, 9 Drawing Sheets

(51) Int. Cl.
 *H01L 23/498* (2006.01)
 *H02M 7/00* (2006.01)

(58) Field of Classification Search
 CPC ......... H01L 25/10; H01L 25/18; H01L 27/00;
  H01L 28/00; H01L 29/00; H01L 30/00;
  H01L 31/00; H01L 33/00; H02M 7/003;
  H01M 3/0433; H01M 3/003
 See application file for complete search history.

(56) References Cited

U.S. PATENT DOCUMENTS

| | | | |
|---|---|---|---|
| 9,917,064 B2 * | 3/2018 | Ishiyama | H01L 23/3185 |
| 2009/0032931 A1 | 2/2009 | Kroneder | |
| 2010/0127387 A1 | 5/2010 | Soda et al. | |
| 2014/0218991 A1 * | 8/2014 | Chen | H01L 23/3735 |
| | | | 363/131 |
| 2014/0374889 A1 * | 12/2014 | Denta | H01L 25/18 |
| | | | 257/666 |
| 2016/0247736 A1 | 8/2016 | Kuwahara | |
| 2017/0301594 A1 | 10/2017 | Takamura | |
| 2020/0185302 A1 * | 6/2020 | Lu | H01L 25/115 |

FOREIGN PATENT DOCUMENTS

| | | | |
|---|---|---|---|
| JP | 2000-333343 | A | 11/2000 |
| JP | 2003-303939 | A | 10/2003 |
| JP | 2004-221366 | A | 8/2004 |
| JP | 2009-33171 | A | 2/2009 |
| JP | 5328645 | B2 | 10/2013 |
| JP | 2014-183196 | A | 9/2014 |
| JP | 6193507 | B2 | 9/2017 |
| JP | 6301857 | B2 | 3/2018 |
| JP | 6314726 | B2 | 4/2018 |
| JP | 6322323 | B2 | 5/2018 |
| JP | 6415676 | B1 | 10/2018 |
| WO | 2019/058454 | A1 | 3/2019 |

* cited by examiner

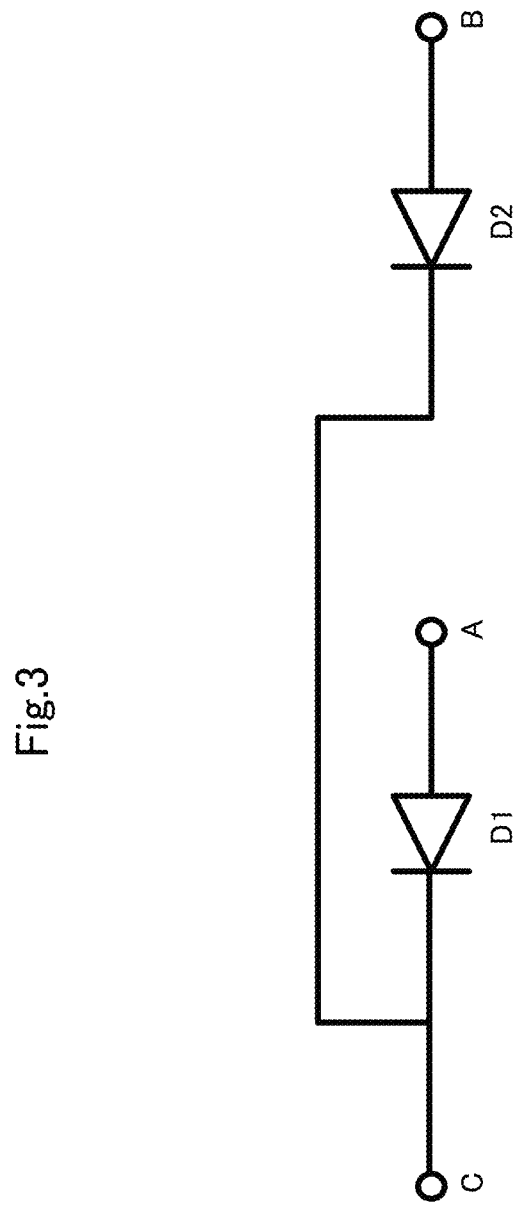

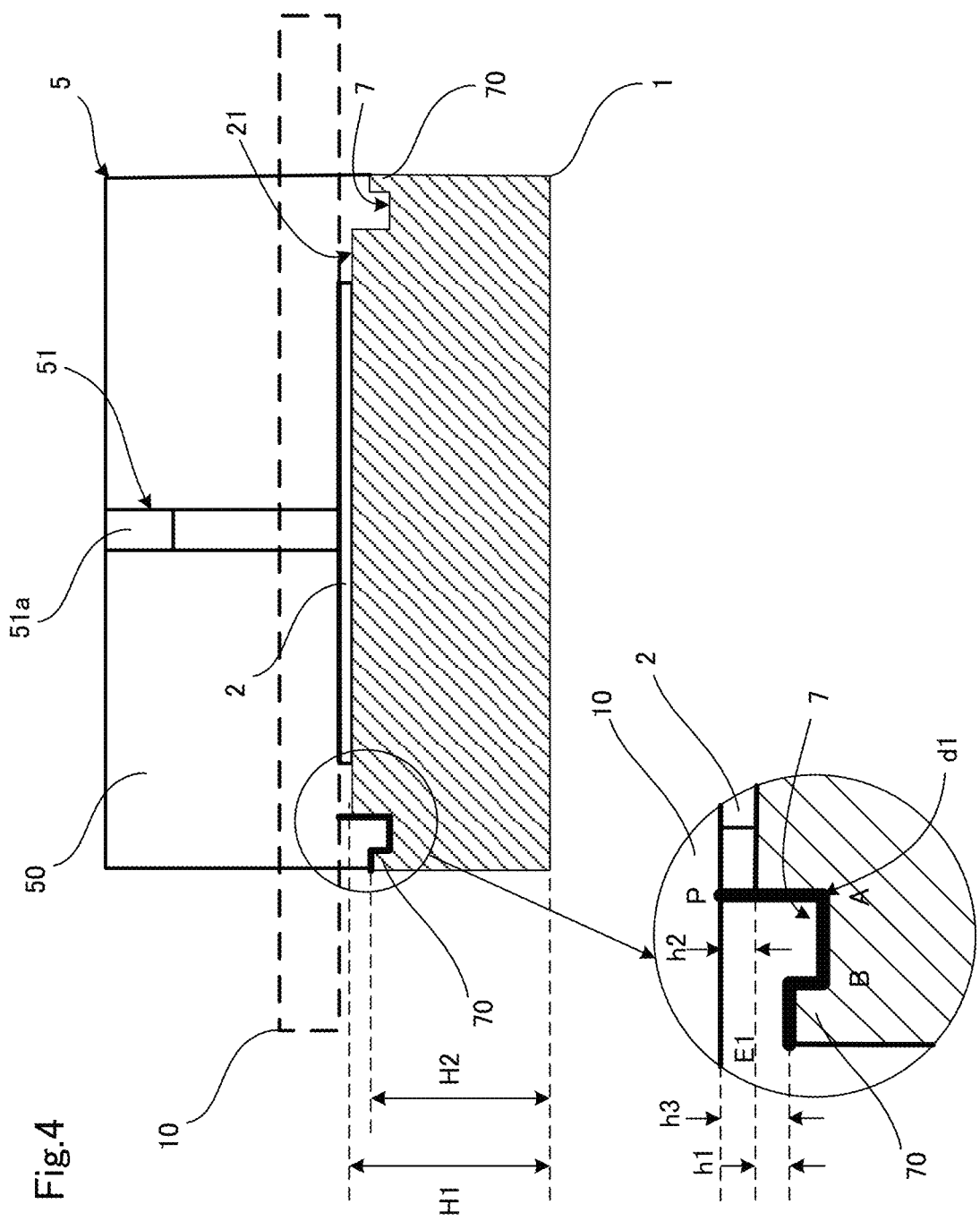

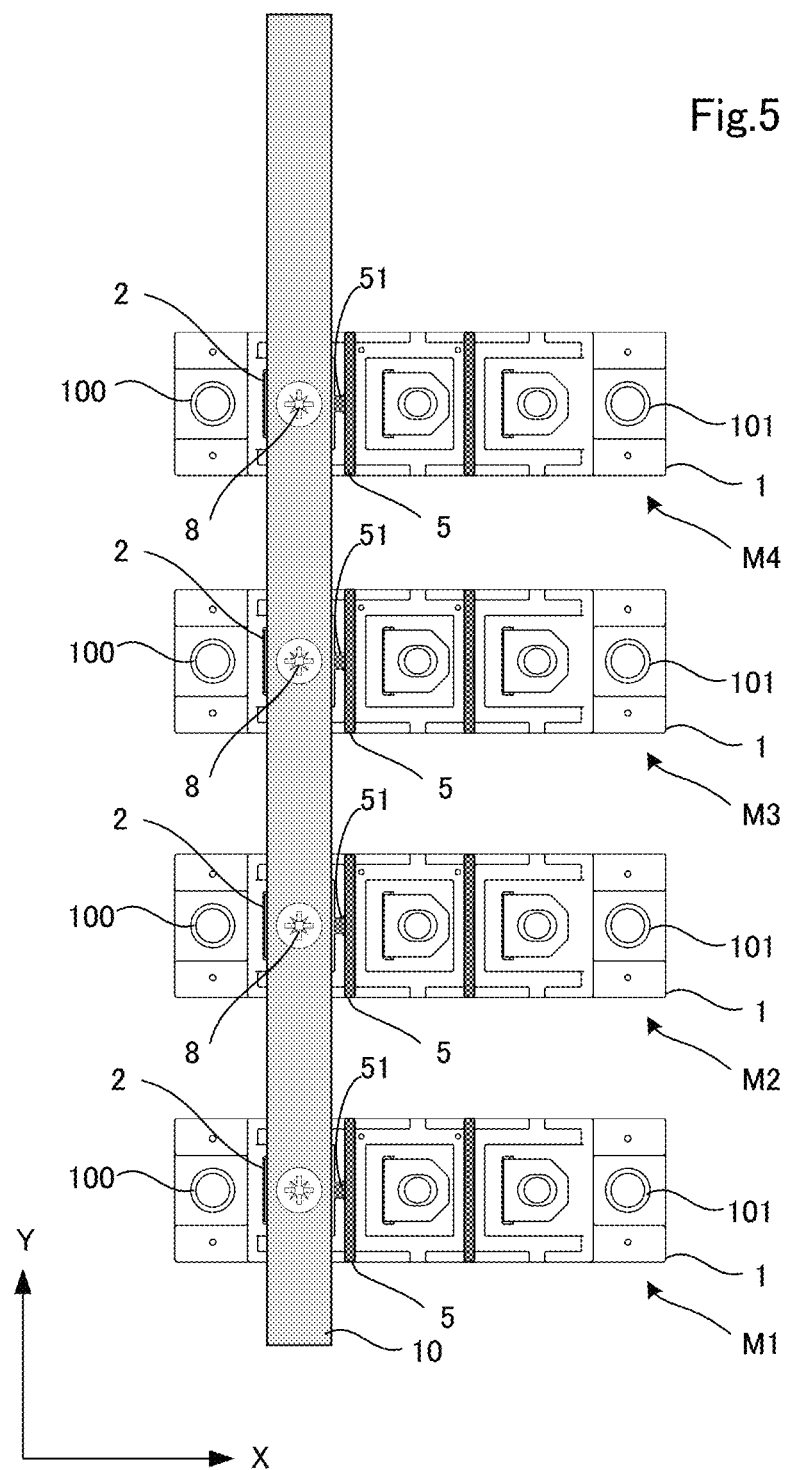

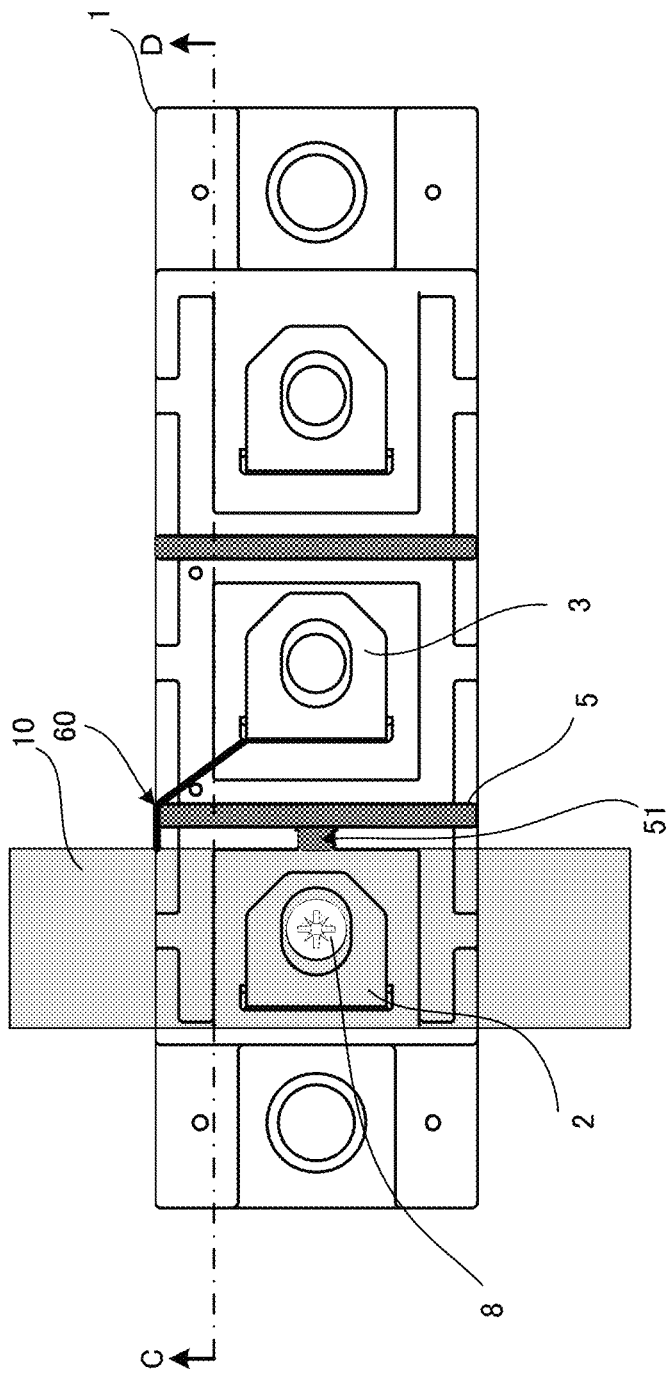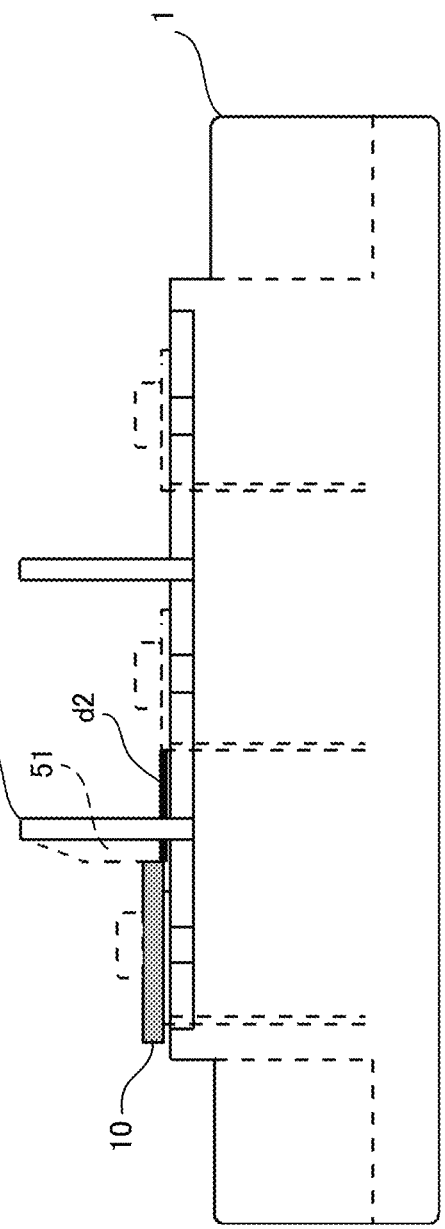
Fig.8A
Fig.8B

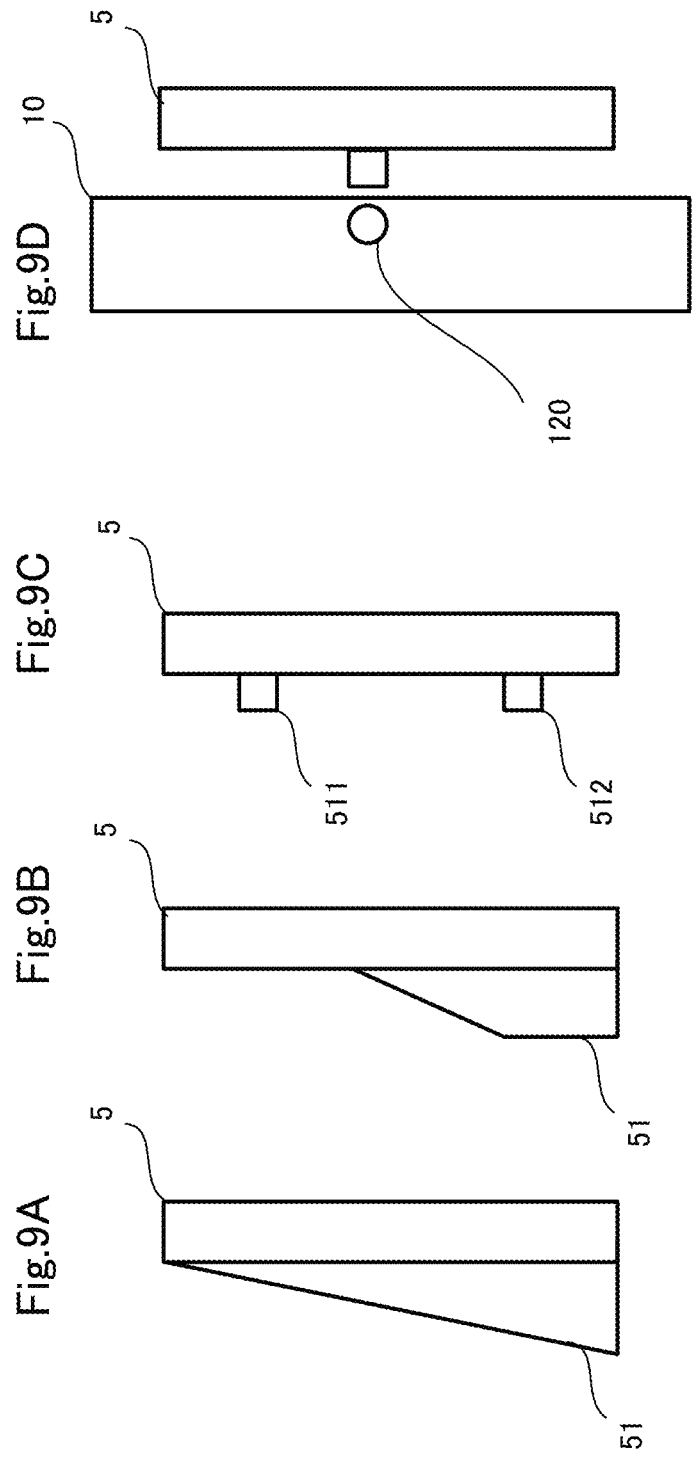

SEMICONDUCTOR MODULE

TECHNICAL FIELD

The present invention relates to a semiconductor module and, and in particular, to a semiconductor module in which a bus bar is to be attached to a case made of a resin.

BACKGROUND ART

The semiconductor module to be mounted in an electrical device is designed so that a creepage distance and a clearance distance between modular terminals are able to be ensured to have a predetermined size. The creepage distance is the shortest distance along a surface of an insulator between terminals, and the clearance distance is the shortest distance through a space between terminals.

The semiconductor module is configured to accommodate a semiconductor element such as a diode and a transistor in a case made of a resin, and arrange a metal base plate on a bottom portion of the case, and a plurality of terminals on a top portion of the case. The semiconductor module has a package structure as a whole.

In a semiconductor module having such a structure, in order to ensure the creepage distance and the clearance distance between the terminals provided on the top portion of the case, the following conventional techniques are proposed.

The first conventional technique discloses a rib (an insulating wall) between terminals to increase the creepage distance and the clearance distance between the terminals (Patent Literature 1). The second conventional technique discloses a groove on a surface of the case to increase the creepage distance (Patent Literature 2).

CITATION LIST

Patent Literature

Patent Literature 1: Japanese Unexamined Patent Application Publication No. H6-21603
Patent Literature 2: Japanese Unexamined Patent Application Publication No. 2003-303939

SUMMARY OF INVENTION

Technical Problem

However, the above configuration including the rib or the groove may be difficult to ensure sufficient creepage and clearance distances. For example, a configuration in which a plurality of semiconductor modules are arranged and a single bus bar is screwed to a common terminal of each semiconductor module may have the following problem.

In other words, the bus bar, when being attached, may be attached out of a predetermined position. At this time, the bus bar may come into contact with a surface of the rib. The creepage and clearance distances between the bus bar and the second terminal adjacent to the first terminal to which the bus bar is to be attached are equal to or less than predetermined design values. Especially when the groove is provided to increase the creepage distance, the effect of this groove is reduced.

In addition, when the clearance distance between the bus bar and the wall of the groove is small while the bus bar is attached, this clearance distance becomes a portion of the creepage distance between the first terminal to which the bus bar is to be attached, and the second terminal adjacent to the first terminal. The creepage distance between the terminals is equal to or less than a preset design value.

An object of the present invention is to provide a semiconductor module capable of reliably ensuring, at a time of attachment of a bus bar, a creepage distance and a clearance distance between a second terminal adjacent to a first terminal to which the bus bar is to be attached and the bus bar.

Solution to Problem

The present invention includes a case accommodating a semiconductor element inside and being entirely molded by a resin,
 a first terminal provided on a top portion of the case and being a terminal to which a bus bar being a flat and elongated metal conductor is to be attached,
 a second terminal provided on the top portion of the case and being adjacent to the first terminal, and
 a rib provided between the first terminal and the second terminal, and
 the rib includes a protrusion protruding toward the bus bar.

The first terminal and the second terminal are provided on the top portion of the case and the rib is provided between these terminals. When the bus bar is attached to the first terminal, a movable range of the bus bar is up to a position at which the bus bar contacts the protrusion of the rib. Since the protrusion of the rib is an obstacle, the bus bar does not contact the surface of the rib. Accordingly, the bus bar is able to be prevented from contacting the surface of the rib. When the bus bar contacts the surface of the rib, the creepage distance and the clearance distance between the bus bar and the second terminal are reduced. However, in the present invention, the bus bar does not contact the surface of the rib because of the protrusion of the rib. Therefore, the creepage distance and the clearance distance between the bus bar and the second terminal are able to be set to a predetermined design value.

An inclined surface provided in the protrusion, when the rib and the case are resin molded, makes it easy to extract the entirety in a vertical direction. In addition, attachment is easy since the bus bar may be descended to an attachment position along the inclined surface.

The protrusion is able to be provided near the center of the rib or at a plurality of positions. The protrusion at the plurality of positions prevents the bus bar from turning at a time of attachment of the bus bar.

A plurality of grooves provided around the first terminal and the second terminal are able to increase the creepage distance between the bus bar and the second terminal by a length in a creepage surface of the grooves. The creepage distance that is able to be increased by the grooves is able to be reliably ensured because the bus bar is unable to move toward the rib any further by the protrusion of the rib.

Advantageous Effects of Invention

In the present invention, the protrusion on the rib is able to prevent the bus bar from coming into contact with the surface of the rib, so that the creepage distance and the clearance distance between the first terminal for the bus bar or for screwing for the bus bar and the second terminal adjacent to this first terminal are able to be reliably set to a design value.

BRIEF DESCRIPTION OF DRAWINGS

FIG. 3 is a circuit diagram of the semiconductor module.

FIG. 4 is an A-B cross-sectional view in FIG. 2.

FIG. 5 shows a top view when four semiconductor modules are arranged at regular intervals in a second direction (a Y direction), with a bus bar attached.

FIG. 8A and FIG. 8B each are a view showing a clearance distance in the plan view of the semiconductor module and a view showing a clearance distance in the C-D cross-sectional view.

FIG. 9A to FIG. 9D are views respectively showing other embodiments.

DESCRIPTION OF EMBODIMENTS

Figure 1:
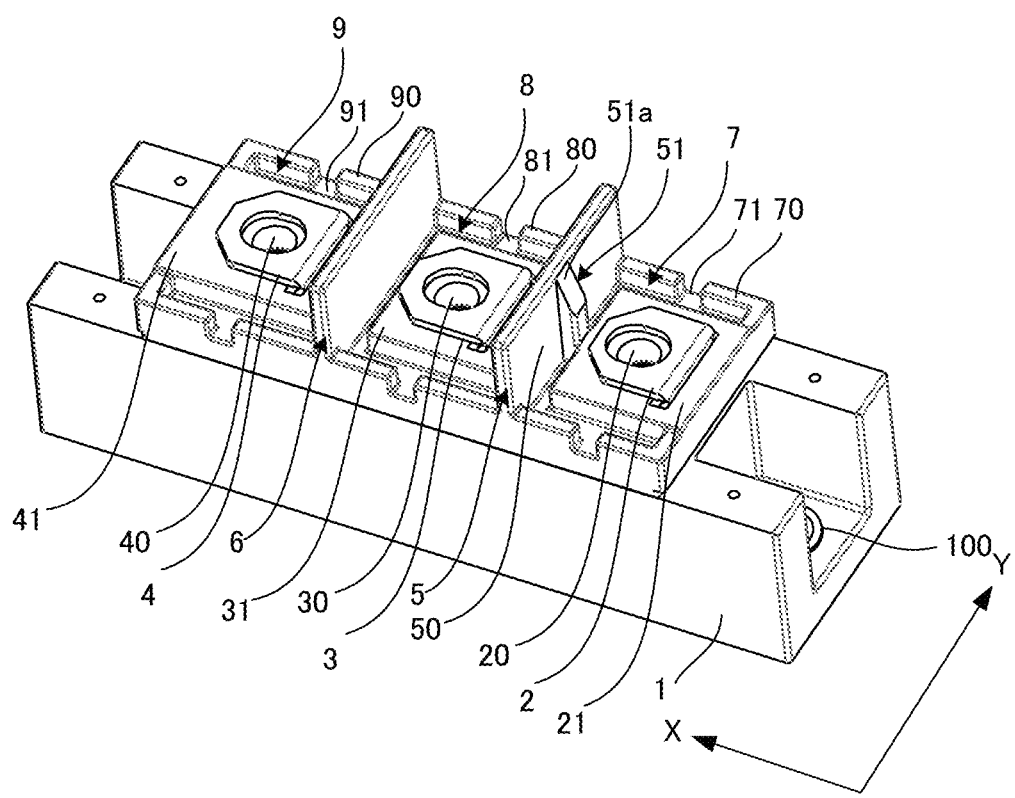
FIG. 1 is a perspective view of a semiconductor module according to an embodiment of the present invention.
Figure 2:
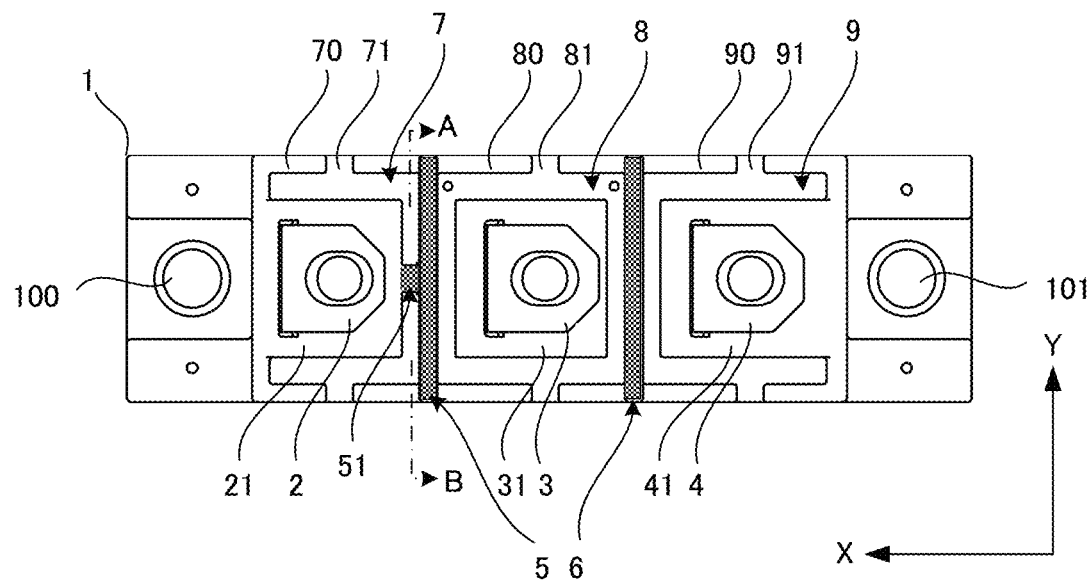
FIG. 2 is a plan view of the semiconductor module.

FIG. 1 is a perspective view of a semiconductor module according to an embodiment of the present invention. FIG. 2 is a plan view of the semiconductor module.

This semiconductor module includes a case 1 made of a resin and having a rectangular parallelepiped shape, and a first terminal 2, a second terminal 3, and a third terminal 4 for screwing that are provided on the case 1 and arranged at predetermined intervals in a longitudinal direction being a first direction (an X direction).

A first terminal surface 21, a second terminal surface 31, and a third terminal surface 41 on which the first terminal 2, the second terminal 3, and the third terminal 4 are respectively placed are formed on a top side of the case 1. The first terminal 2 is placed on the first terminal surface 21, the second terminal 3 is placed on the second terminal surface 31, and the third terminal 4 is placed on the third terminal surface 41. Each terminal 2 to 4 is formed such that a metal vertical piece previously molded into a terminal shape is inserted into the case 1 and an upper end portion is processed to be bent. A screw insertion hole is formed in a central portion of each terminal 2 to 4.

Two diodes D1 and D2 as semiconductors are accommodated in the case 1. FIG. 3 is a circuit diagram. A cathode of the diode D1 and a cathode of the diode D2 are connected to form a common terminal C, and an anode of the diode D1 is formed as a first anode terminal A and an anode of the diode D2 is formed as a second anode terminal B.

The common terminal C is connected to the first terminal 2 in the case 1. The first anode terminal A is connected to the second terminal 3 in the case 1. The second anode terminal B is connected to the third terminal 4 in the case 1. The first terminal 2, as will be described below, is a terminal to which the bus bar is attached by screwing. The second and third terminals 3 and 4 are terminals to which a cable end portion is attached by screwing. Screw portions 20, 30, and 40 are formed below the terminals 2 to 4, on the terminal surfaces 21, 31, and 41. In order to screw the bus bar and the cable end portion to the terminals 2 to 4, a screw hole portion of the bus bar and the cable end portion is placed on each terminal 2 to 4 and tightened to the screw portions 20 to 40 from above by a screw through a washer or the like.

Screwing portions 100 and 101 for fixing a case are provided on both ends in the first direction (the X direction) of the case 1. The screwing portions 100 and 101 are used to fix the case 1 to a substrate in a housing of an electrical device with a screw.

The case 1 includes a first rib 5 and a second rib 6 on the top portion. This first rib 5 and the second rib 6 are provided in the second direction (the Y direction) perpendicular to the first direction (the X direction). The first rib 5 is provided between the first terminal 2 and the second terminal 3, and the second rib 6 is provided between the second terminal 3 and the third terminal 4. These ribs 5 and 6 are used to increase a creepage distance and a clearance distance between each terminal. In addition, these ribs 5 and 6 are integrally molded with the case 1.

The first rib 5 includes a protrusion 51 in a central portion of a surface 50. The protrusion 51 faces the first terminal 2 for a bus bar. The protrusion 51 is integrally formed with the rib 5 in the vertical direction, in the central portion in the second direction (the Y direction) of the surface 50. In addition, an upper end portion of the protrusion 51 is an inclined surface 51a inclining downward from an upper end. A lower portion continuous with the inclined surface 51a is a vertical plane. The protrusion 51 is thus configured by the inclined surface 51a and the vertical plane continuous with the inclined surface. As a result, the inclined surface 51a becomes a draft slope, which makes it easy to punch a mold during molding.

A first groove 7, a second groove 8, and a third groove 9 are provided around each terminal 2 to 4, more specifically, around each terminal surface 21, 31, and 41, on the top side of the case 1. The first groove 7 is provided before and behind the first terminal 2 and on a left side (FIG. 1: a side near the first rib 5) of the first terminal 2. The second groove 8 is provided before and behind the second terminal 3 and on a left side and a right side (FIG. 1: a side near the second rib 6 and a side near the first rib 5) of the second terminal 3. The third groove 9 is provided before and behind the third terminal 4 and on a right side (FIG. 1: a side near the second rib 6) of the third terminal 4.

The first groove 7 includes a first wall 70 provided outside the case 1. A cutout 71 is formed in a central portion of the first wall 70. The first wall 70 and the cutout 71 are provided before and behind the first terminal 2. The cutout 71 is provided to drain the first groove 7. The second groove 8 includes a second wall 80 provided outside the case 1. A cutout 81 is formed in a central portion of the second wall 80. The second wall 80 and the cutout 81 are provided before and behind the second terminal 3. The cutout 81 is provided to drain the groove 8. The third groove 9 includes a third wall 90 provided outside the case 1. A cutout 91 is formed in a central portion of the third wall 90. The third wall 90 and the cutout 91 are provided before and behind the third terminal 4. The cutout 91 is provided to drain the third groove 9.

A height of each wall 70, 80, and 90 is set to be smaller than a height of each terminal surface 21, 31, and 41.

FIG. 4 is an A-B cross-sectional view in FIG. 2. As illustrated, a height (a height from a bottom surface of the case 1) of the first terminal surface 21 is represented by H1, and a height of the first wall 70 is represented by H2, which satisfies H1−H2=h1. A height (a thickness) of the first terminal 2 is represented by h2. h1+h2=h3 is satisfied. h3 is a distance between a bottom surface of the bus bar 10 and a top surface of the first wall 70. A distance between the bottom surface of the bus bar 10 and the top surface of the wall 70 is set to h3, which is an important configuration to reliably set the creepage distance d1 to a design value, as described below.

Semiconductor modules with the above configuration are mounted on the substrate in the electrical device, and then the bus bar and the cable end portion are screwed to each semiconductor module.

FIG. 5 shows a plan view when four semiconductor modules are arranged at regular intervals in the second direction (the Y direction), with a bus bar attached.

The four semiconductor modules M1 to M4 are screwed to the substrate in the housing of the electrical device by the screwing portions 100 and 101 provided on the both ends of the case 1, respectively.

The bus bar 10 being a flat and elongated metal conductor, when being closest to the rib 5 in FIG. 5, comes into contact with the protrusion 51 provided in the first rib 5 of each case 1. Normally, the bus bar 10 does not contact the protrusion 51 of the rib 5 at the time of the attachment.

Subsequently, a creepage distance d1 and a clearance distance d2 between the first terminal 2 and the second terminal adjacent to the first terminal will be described with reference to FIG. 6A and FIG. 6B to FIG. 8A and FIG. 8B. The creepage distance d1 is the shortest distance along a surface of an insulator between the terminals 2 and 3, and the clearance distance d2 is the shortest distance through a space between the terminals 2 and 3.

Figure 6A:
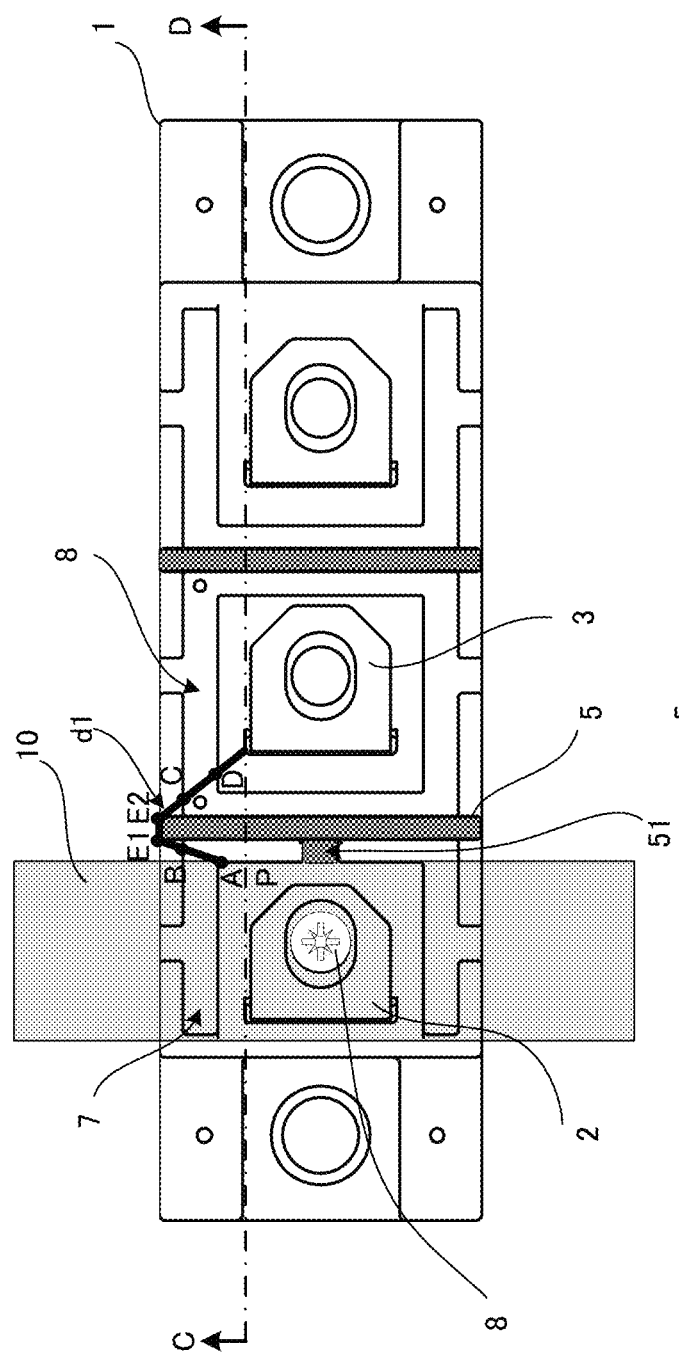
FIG. 6A and FIG. 6B each are a view showing a creepage distance in the plan view of the semiconductor module and a view showing a creepage distance in a C-D cross-sectional view.
Figure 6B:
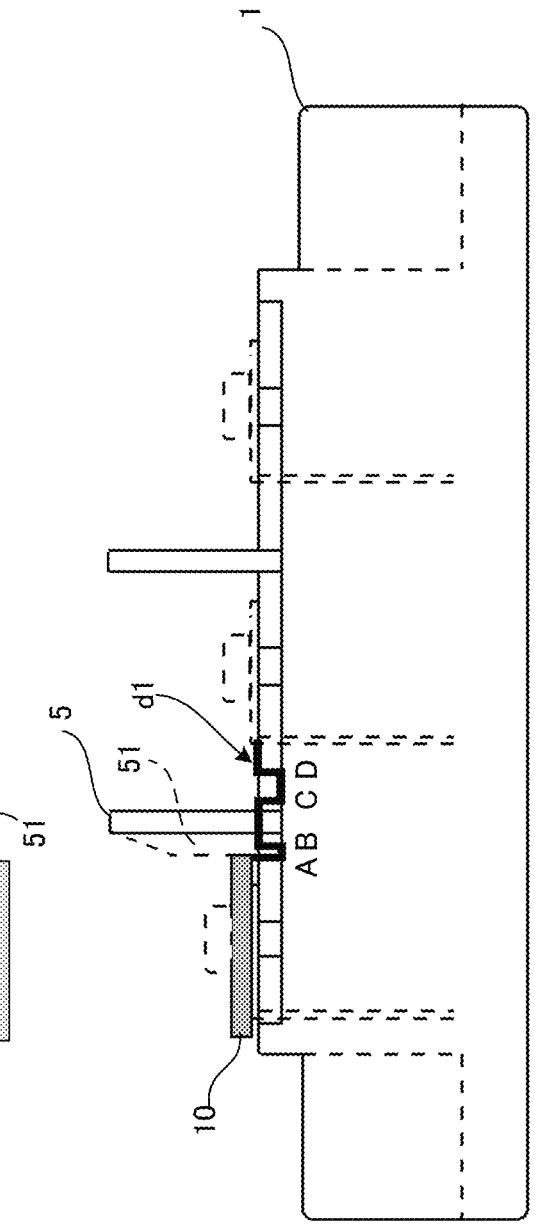

FIG. 6A is a plan view of one case 1, and shows the creepage distance d1 from the top side of the case 1. In addition, FIG. 6B shows a C-D cross-sectional view of FIG. 6A. In these figures, each point of A, B, C, and D shows a position of the groove 7 or 8 in which the creepage distance d1 is measured in the vertical direction.

When the creepage distance is considered, whether there is any clearance distance of less than 1 mm is examined. In other words, in a case in which the clearance distance is less than 1 mm, the clearance distance becomes a portion of the creepage distance. Therefore, in the portion, the creepage distance is no longer a distance along the insulator. Herein, in a case in which the thickness of the first terminal 2 is less than 1 mm, while the bus bar 10 is attached, the distance h2 between the bottom surface of the bus bar 10 and the first terminal surface 21 is less than 1 mm. Therefore, the distance h2 becomes a portion of the creepage distance d1 (see FIG. 4). In other words, when measurement of the creepage distance d1 starts from the first terminal 2, the creepage distance d1 is the total distance of the bottom surface of the bus bar 10=>the first terminal surface 21=>the first groove 7=>a side surface of the first rib 5=>the second groove 8=>the second terminal surface 31=>the second terminal 3. In FIG. 4, the distance shown by a bold line shows a portion of the creepage distance d1.

Hereinafter, in a case in which the thickness of the first terminal 2 is less than 1 mm, the bottom surface of the bus bar 10 is a starting point of the creepage distance d1, which will be described in detail.

As shown in FIG. 4, the distance h2 between the bottom surface of the bus bar 10 and the first terminal surface 21 is less than 1 mm. Therefore, insulation is unable to be ensured between the first terminal 2 and the bus bar 10. Accordingly, a starting point P of the creepage distance d1 is not an end portion of the first terminal 2, but the bottom surface of the bus bar 10 that faces the first terminal surface 21. The creepage distance d1 reaches a top surface of the first wall 70 via an A point to a B point of the first groove 7 through the first terminal surface 21 from the P point.

On the other hand, the height H2 of the first wall 70 is formed to be smaller only by h1 than the height H1 of the first terminal surface 21. In addition, the height of the first terminal 2 is h2. Therefore, H2 is set to a height such that the distance h3 (=h1+h2) between the bottom surface of the bus bar 10 and the top surface of the first wall 70 is 1 mm or more, the clearance distance of h3 does not become a portion of the creepage distance. In short, the creepage distance d1 is measured along the top surface of the first wall 70.

For the above reasons, the creepage distance d1 is a distance from the following (1) to (13) in FIG. 4, FIG. 6A, and FIG. 6B.

(1) The starting point P of the bottom surface of the bus bar 10 (see FIG. 4)
(2)=>A (descending vertically from a wall surface of the first groove 7)
(3)=>The bottom surface of the first groove 7 (passing obliquely the bottom surface of the first groove 7)
(4)=>B (ascending obliquely the wall surface of the first groove 7)
(5)=>The first wall 70 (passing obliquely the top surface of the first wall 70)
(6)=>E1 (the side surface of the first rib 5)
(7)=>E2 (passing horizontally outside the side surface of the first rib 5)
(8)=>The second wall 80 (passing obliquely the top surface of the second wall 80)
(9)=>C (descending obliquely from a wall surface of the second groove 8)
(10)=>The bottom surface of the second groove 8 (passing obliquely the bottom surface of the groove 8)
(11)=>D (ascending obliquely the wall surface of the second groove 8)
(12)=>The second terminal surface 31
(13)=>The second terminal 3

It is to be noted that, in FIG. 6A and FIG. 6B, the creepage distance d1, while being shown as descending (or ascending) vertically in B-D, descends (or ascends) obliquely in practice, as shown in the above (4), (9), and (11).

As a modification, in a case in which the thickness of the first terminal 2 is 1 mm or more, h2 is a sufficiently long distance. In this case, the starting point P of the creepage distance d1 is a left end (FIG. 4) of the first terminal 2. The creepage distance d1 corresponds to the following (1a) (1b) in place of the above (1).

(1a) Starting point P (not shown) at the left end of the first terminal 2 (FIG. 4)
(1b) Distance to the first groove 7 on the first terminal surface 21

As described above, in the embodiment shown in FIG. 4, the creepage distance d1 is a path from the starting point P (see FIG. 4) on the bottom surface of the bus bar 10 to the grooves 7 and 8 on both left and right sides of the first rib 5. As a result, the creepage distance d1 of a sufficient length is able to be ensured.

As a reference example, the creepage distance d1 in a case in which the heights of the first wall 70 and the first terminal surface 21 are the same, that is, H1=H2, will be described. In such a case, the creepage distance d1 is reduced. The reason for this will be described with reference to FIG. 7.

Figure 7:
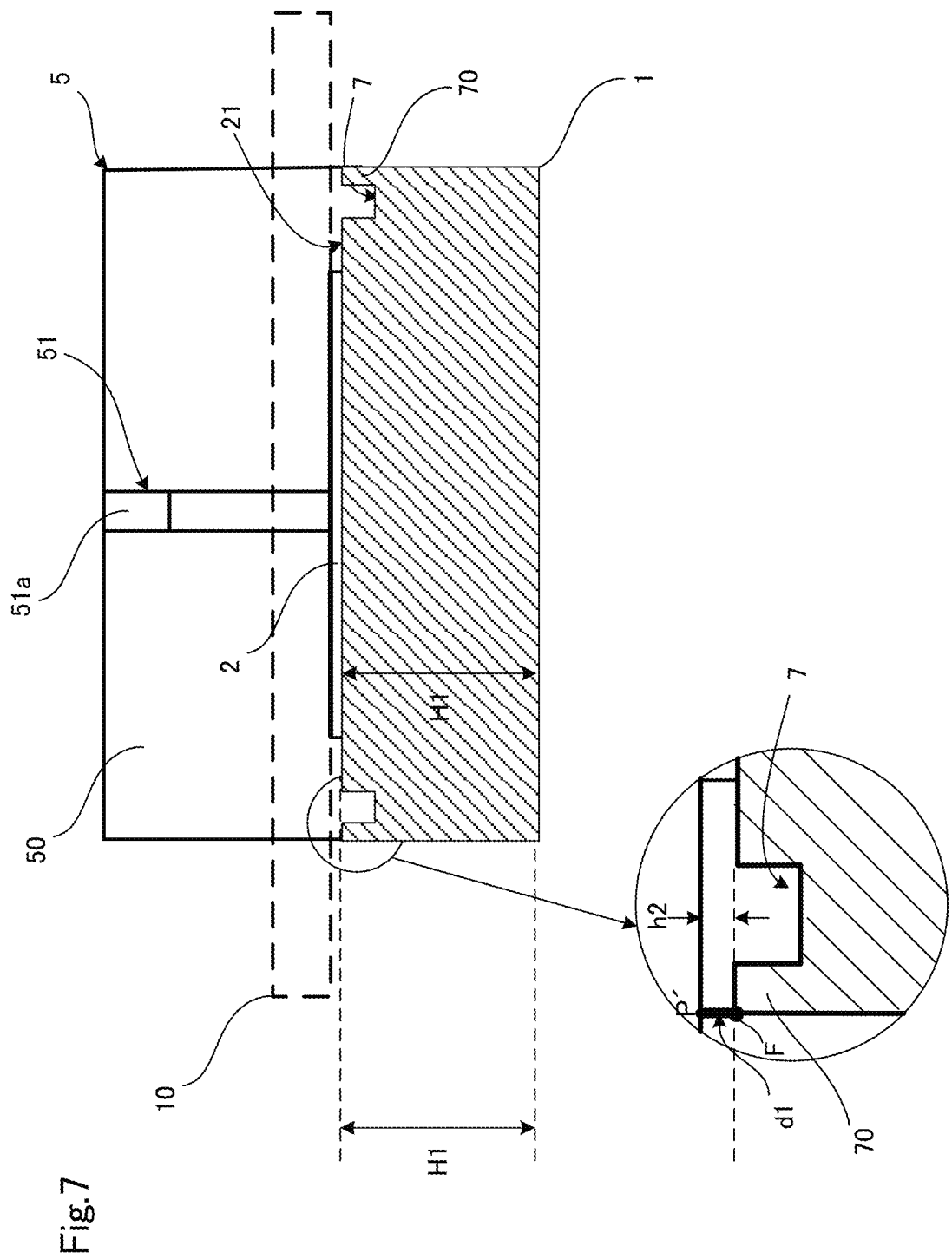
FIG. 7 is a view showing a creepage distance when a wall 70 is not cut out.

In FIG. 7, the first groove 7 is provided, and the height H2 of the first wall 70 is the same as the height H1 of the first terminal surface 21. As described previously, when h2 is less than 1 mm, the clearance distance of h2 is measured as a portion of the creepage distance. Therefore, a starting point P' of the creepage distance d1 is the bottom surface of the bus bar 10 that faces an end portion of the first wall 70. In short, the groove 7 provided to increase the creepage distance is unable to be a portion of the creepage distance d1.

Specifically, the creepage distance d1 includes the following (14) to (16) instead of the above (1) to (7). The above (8) and the subsequent are the same also in the reference example.

(14) The starting point P' of the bottom surface of the bus bar 10 (see FIG. 7)
(15)=>F (descending vertically from P' to an outer end portion on the top surface of the first wall 70)
(16)=>linearly passing the side surface of the first rib 5 from the first wall 70

In this manner, in the reference example, in comparison with FIG. 4 showing the present embodiment, a vertical and horizontal distance in the first groove 7 is unable to be utilized, which reduces the creepage distance d1.

As another reference example, the creepage distance d1 in a case in which the protrusion 51 is not provided in the first rib 5 will be described. With such a configuration, the bus bar 10 may contact a surface of the first rib 5. Then, when the bus bar 10 contacts the surface of the first rib 5, the starting point of the creepage distance d1 is a contact point regardless of the height of the first wall 70. Therefore, the creepage distance d1 is further reduced.

In the present embodiment, as shown in FIG. 4, the height of the first wall 70 is made as low as H2, so that the starting point P of the creepage distance d1 is a position (a position that faces the A inside the first groove 7) that faces the first terminal surface 21 of the bus bar 10. As a result, the first groove 7 reliably becomes a portion of the creepage distance d1.

As described above, in the present embodiment, the protrusion 51 of the first rib 5 is provided, and the height of the first wall 70 is made smaller than the first terminal surface 21, so that the first groove 7 is able to be made into a portion of the creepage distance d1 when the bus bar 10 is attached. Then, when the height H2 of the first wall 70 is set to a height in which h1+h2=h3 is 1 mm or more, the safety standards can be satisfied. It is to be noted that, when h1 is set to 1 mm or more, h1+h2>1 mm is satisfied, so that the creepage distance d1 that ensures insulation is able to be ensured even when the first terminal 2 is changed to a terminal with a smaller h2.

Subsequently, the clearance distance d2 will be described.

FIG. 8A is a top view of one case 1, and shows the clearance distance d2 from the top side of the case 1. In addition, FIG. 8B shows a C-D cross-sectional view of FIG. 8A.

The clearance distance d2 is the shortest distance passing a space between the first terminal 2 and the second terminal 3 adjacent to the first terminal. While the bus bar 10 is attached, as illustrated, a position Q that faces the side surface of the first rib 5 at a right end portion of the bus bar 10 is the starting point, and thus the clearance distance d2 is the shortest distance in space from Q=>a side surface of the bus bar 10=>the second terminal 3. In a front view, the clearance distance d2 is horizontal, as shown in FIG. 8B.

From FIG. 8A and FIG. 8B, the clearance distance d2 is able to be reliably ensured by the thickness of the protrusion 51 of the first rib 5.

FIG. 9A to FIG. 9D show other embodiments. FIG. 9A to FIG. 9C show a shape of the protrusion 51. FIG. 9A shows the protrusion 51 is a triangle in a front view, and FIG. 9B shows the protrusion 51 being formed downward from a central portion of the first rib 5 in the front view. FIG. 9C shows the protrusion 51 being formed near both left and right sides of the rib 5 in the front view. According to this, the bus bar is prevented from turning at the time of attachment of the bus bar 10. In this case, two protrusions 511 and 512, as illustrated, need to be slightly away from left and right end portions of the rib 5 and more inside than the front and rear first grooves 7. In addition, the two protrusions 511 and 512 need to be formed at positions that face the first terminal surface 21. Therefore, the effect (to increase the creepage distance) of the first groove 7 is reliably obtained. FIG. 9D shows an example in which a position of a screw hole 120 in the bus bar 10 is slightly eccentric to the right side. In this example, the bus bar 10 is able to be attached to a position away from the first rib 5. When the bus bar 10 is attempted to be attached upside down, a left end portion of the bus bar 10 touches the first rib 5, which makes the attachment impossible. Accordingly, the creepage distance d1 and the clearance distance d2 are able to be increased. In addition, the bus bar 10 is able to be prevented from being attached in a wrong direction.

As described above, in the present embodiment, the protrusion 51 is provided in the first rib 5, so that the creepage distance between the bus bar 10 and a nearby terminal is able to be reliably ensured at the time of the attachment of the bus bar 10. In addition, the clearance distance is also able to be increased.

REFERENCE SIGNS LIST

1—case
2—first terminal
3—second terminal
4—third terminal
5—first rib
6—second rib
51—protrusion

The invention claimed is:

1. A semiconductor module comprising:
a case accommodating a semiconductor element inside and being entirely molded by a resin;
a first terminal surface provided on a top portion of the case;
a second terminal surface provided on the top portion of the case and being adjacent to the first terminal surface;
a first terminal placed on the first terminal surface and being a terminal to which a bus bar being a flat and elongated metal conductor is to be attached;
a second terminal placed on the second terminal surface; and
a rib provided between the first terminal and the second terminal, wherein the rib includes a protrusion protruding toward the bus bar.

2. The semiconductor module according to claim 1, wherein the protrusion includes an inclined surface inclined downward from an upper end.

3. The semiconductor module according to claim 2, wherein the protrusion includes a vertical surface extending downward from the inclined surface.

4. The semiconductor module according to claim 1, wherein the protrusion is provided near a center of the rib.

5. The semiconductor module according to claim 1, wherein the protrusion is provided at a plurality of positions of the rib.

6. The semiconductor module according to claim 1, wherein a plurality of grooves are provided around the first terminal and the second terminal.

7. The semiconductor module according to claim 1, further comprising:

a first groove provided around the first terminal surface and including a first wall outside the case; and a second groove provided around the second terminal surface and including a second wall outside the case, wherein:

the rib rises from the first groove and the second groove to partition the first wall and the second wall and is formed between the first terminal and the second terminal; and a height of the first wall is set to be smaller than a height of the first terminal surface.

8. The semiconductor module according to claim 7, wherein a height of the second wall is set to be a same as the height of the first wall.

* * * * *